United States Patent [19]

Kandpal et al.

[11] Patent Number: 5,108,167

[45] Date of Patent: Apr. 28, 1992

[54] METHOD AND APPARATUS FOR OBTAINING A SIMPLIFIED ELECTRO-OPTICAL SIGNAL COUPLING SYSTEM

[75] Inventors: Pramode Kandpal, Westlake Village, Calif.; Peter J. Morgan, Allen, Tex.; Michael Wald, Rowlett, Tex.; Andrew Moore, Plano, Tex.

[73] Assignee: Rockwell International Corporation, El Segundo, Calif.

[21] Appl. No.: 606,219

[22] Filed: Oct. 31, 1990

Related U.S. Application Data

[63] Continuation-in-part of Ser. No. 552,717, Jul. 16, 1990, abandoned, which is a continuation-in-part of Ser. No. 350,660, May 9, 1989, abandoned.

[51] Int. Cl.⁵ .......................... G02B 6/26; G02B 6/36
[52] U.S. Cl. ........................................... 385/33
[58] Field of Search ............. 350/96.10, 96.15, 96.18, 350/96.20, 96.21, 320

[56] References Cited

U.S. PATENT DOCUMENTS

| | | | |
|---|---|---|---|
| 4,421,383 | 12/1983 | Carlsen | 350/96.21 |
| 4,509,827 | 4/1985 | Cowen et al. | 350/96.18 X |
| 4,701,011 | 10/1987 | Emkey et al. | 350/96.18 X |
| 4,705,351 | 11/1987 | Toda | 350/96.18 |
| 4,746,195 | 5/1988 | Auracher et al. | 350/320 |
| 4,747,657 | 5/1988 | Chaoui et al. | 350/96.20 |
| 4,762,385 | 8/1988 | Fuse | 350/96.18 |
| 4,787,013 | 11/1988 | Sugino et al. | 362/32 |
| 4,836,633 | 6/1989 | Morgan et al. | 350/96.18 |

FOREIGN PATENT DOCUMENTS 0083709 4/1988 Japan ................ 350/96.15

*Primary Examiner*—Akm Ullah
*Attorney, Agent, or Firm*—Bruce C. Lutz; V. Lawrence Sewell

[57] ABSTRACT

A laser signal coupling device one embodiment of which comprises a transmitter where a laser diode is coupled to a single mode fiber optic cable through the use of a lens whose position relative the diode is kept constant but whose length is adjusted to obtain a beam waist for the focused beam at some predefined point such as inside the end of the fiber optic cable. Such a positioning of the beam waist can increase the yield by reducing the effect of alignment variations in axial, radial and angular directions as well as reduce noise from fiber end surface reflections. The same concept may be used to accurately focus signaling received from an optic cable, in a surface of a signal detector. Further, the concept may be used for focusing between optic cable of different types such as converting from multimode to single-mode fiber optic cable.

10 Claims, 8 Drawing Sheets

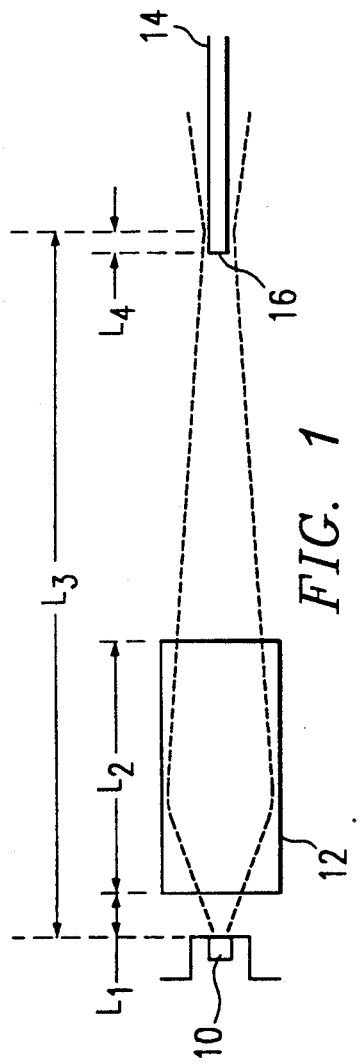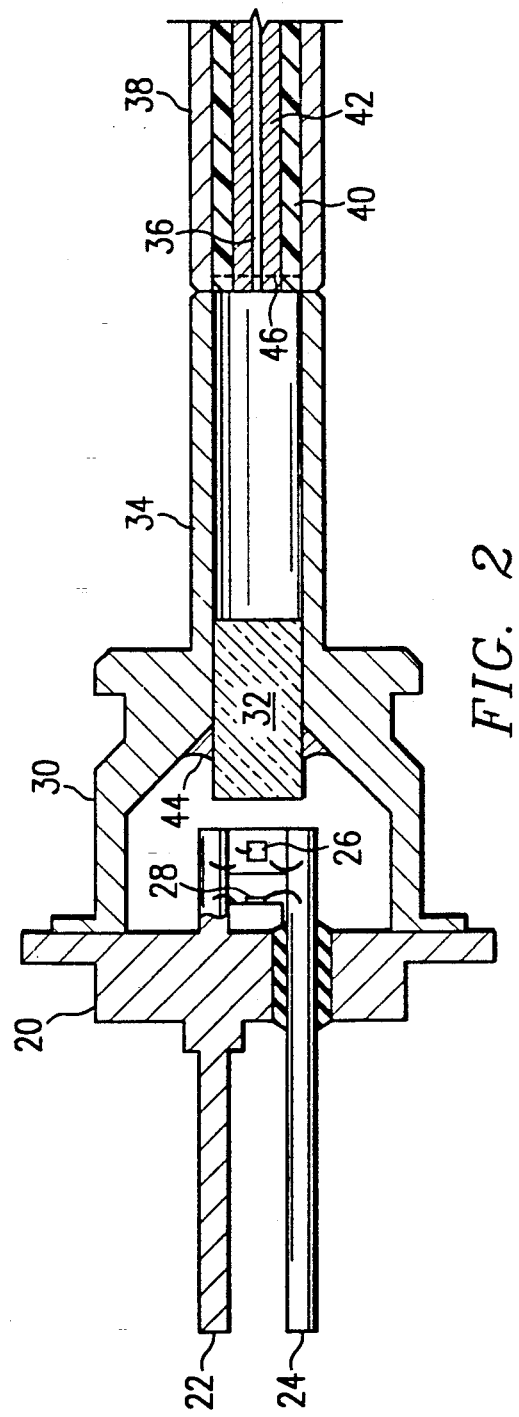

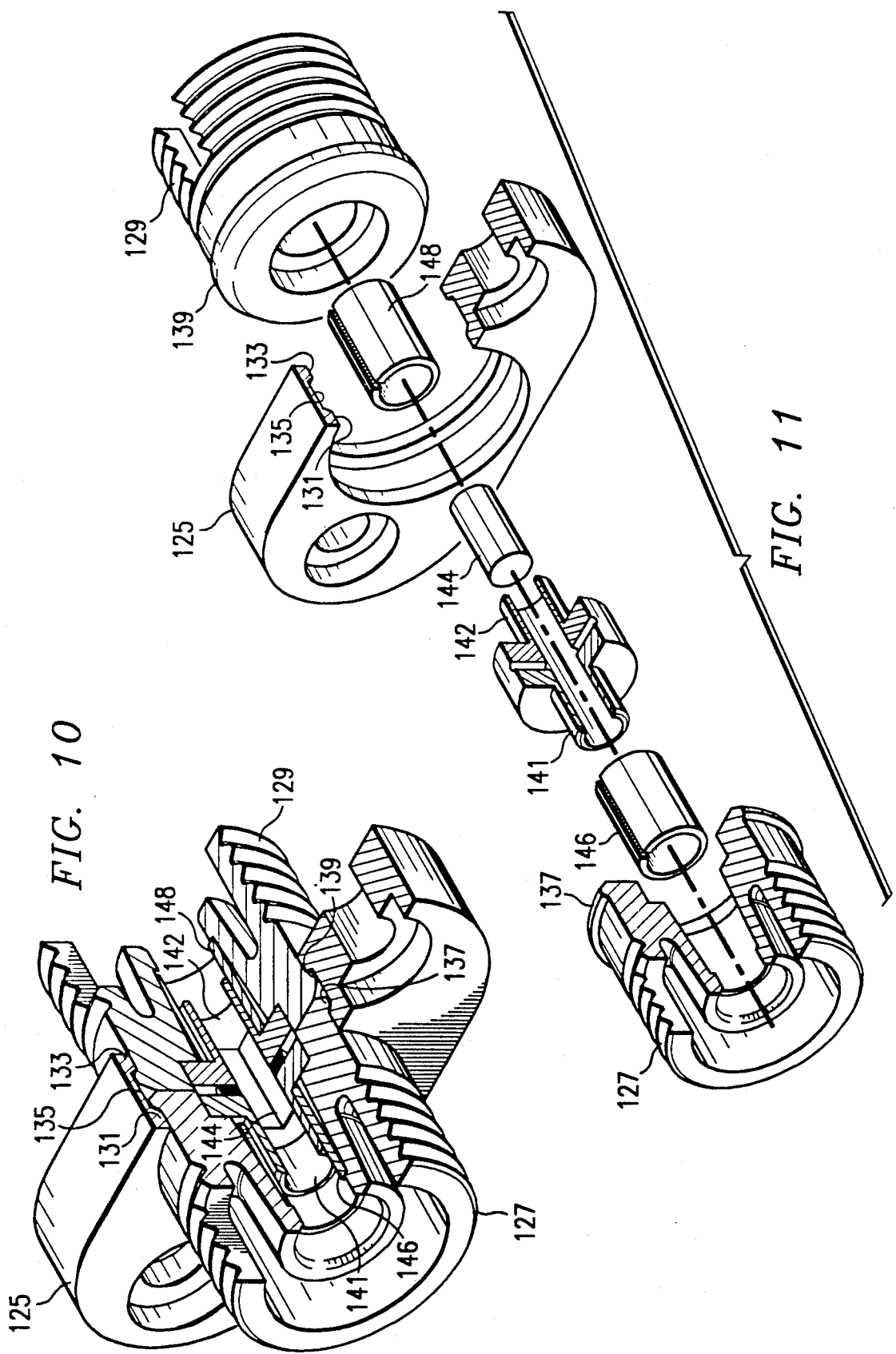

METHOD AND APPARATUS FOR OBTAINING A SIMPLIFIED ELECTRO-OPTICAL SIGNAL COUPLING SYSTEM

THE INVENTION

The present invention is a continuation-in-part, of a previous application, Ser. No. 07/552,717, filed 16 Jul. 1990, now abandoned which is a further continuation-in-part of an application, Ser. No. 07/359,660, filed 9 May 1989 now abandoned, in the names of the present inventors and assigned to the same assignee as the present invention.

The present invention is generally concerned with electronics and more specifically concerned with laser signal optics. Even more specifically, it is concerned with an approach to increasing the yield from a fiber optic coupling device by focusing a beam at a predetermined point such as inside the end of the coupled fiber optic cable and obtaining this focused point or position by adjusting the length of a graded index material focusing device.

BACKGROUND OF THE INVENTION

A conventional laser transmitter comprises a large beam angle laser diode coupled to a single mode fiber core having a typical diameter of ten micrometers or microns. In order to improve the coupling between the laser diode and the fiber, the fiber tip is often reshaped into a lens. This arrangement increases the coupling efficiency but this efficiency is obtained at the expense of reduced offset and alignment tolerances. Also, coupling devices made in this manner require considerable time for the reshaping and the alignment of the parts.

For applications such as local loop networks, it is possible to obtain satisfactory amounts of light with less than maximum coupling efficiency. Under these conditions, more relaxed alignment tolerances can be used to attain an acceptable manufacturing yield while still achieving low cost.

The present device establishes a fixed length between the laser transmitter light source and a point interior the end of the single mode fiber optic core to which the light is to be coupled. A fixed distance is also established between a graded index (GRIN) lens and the light source. The length of the lens is then mechanically adjusted by sawing, grinding and/or polishing in accordance with its internal optical characteristics to make sure that the beam waist of the focused light beam does, in fact, occur at the desired point inside the fiber optic cable where this distance between the light source and the point is defined as the conjugate length. It has been ascertained that variations in axial, radial and angular alignment of the fiber optic core with respect to its optimum position, produce less variation in coupling efficiency when the beam waist is situated inside the fiber optic core rather than at the surface of the core as used in the prior art. Further, by focusing the beam at this point, signal noise occurring in the form of reflections from the end surface is reduced.

The same parameters, as established above, apply for using the concept in receiving signals from a fiber optic cable and detecting these signals using a photodiode, or other optical signal sensitive device. It is important that the beam be focused reasonably accurately onto the surface of the detecting device, rather than being focused in front of or behind the device. Again, the length of the GRIN lens is adjusted to accomplish the beam waist being focused at the proper place.

The concept can also be used in a straight coupling device for coupling two fiber optic cables. While fiber optic cables of like styles can transfer a reasonable amount of energy by placing the end of one single-mode fiber adjacent a further single-mode fiber of the same diameter, if different diameters of single-mode fibers are involved, or if there is intended to be a transfer of signal energy between multi-mode and single-mode fibers in either, or both directions, some type of focusing device greatly improves the signal transfer efficiency. Again, it is believed, desirable by applicants that the beam waist of the signal being focused fall inside the fiber optic cable rather than on the surface of the cable to minimize signal noise occurrence variations in coupling efficiency due to manufacturing variations which affect axial, radial and angular alignment of the two art fiber optic cores, one with respect to the other.

Although, as mentioned above, applicants believe that the desirable approach in focusing the optic signal is to focus it such that it falls inside a fiber optic cable. However, since the concept presented is involved in adjusting a GRIN lens in accordance with detected parameters, the concept includes focusing the beam waist at any point, including, just prior to the end of the fiber optic cable, if some reasonable advantage may be obtained by having the beam waist focused at some desired point other than that believed to be the preferred embodiment by the present applicants.

It is thus an object of the present invention to provide an improved coupling device for optimally coupling electro-optical signals from a lightwave source such as a laser diode transmitter to a lightwave sink or receiver such as a single-mode fiber optic cable.

Other objects and advantages of the present invention will be apparent from a reading of the specification and appended claims in conjunction with the drawings wherein:

FIG. 1 is a schematic representation of the parts used in the invention for illustrating the focusing concept;

FIG. 2 illustrates an assembly of parts for one embodiment of an optical module incorporating the components of FIG. 1;

FIG. 10 illustrates an isometric view of a coupler utilizing the principles of the present invention for coupling to fiber optic cables for light transmission in either or both directions; and FIG. 11 is an isometric view of FIG. 10 using the same designators as are used in FIG. 10.

DETAILED DESCRIPTION

Figure 3:
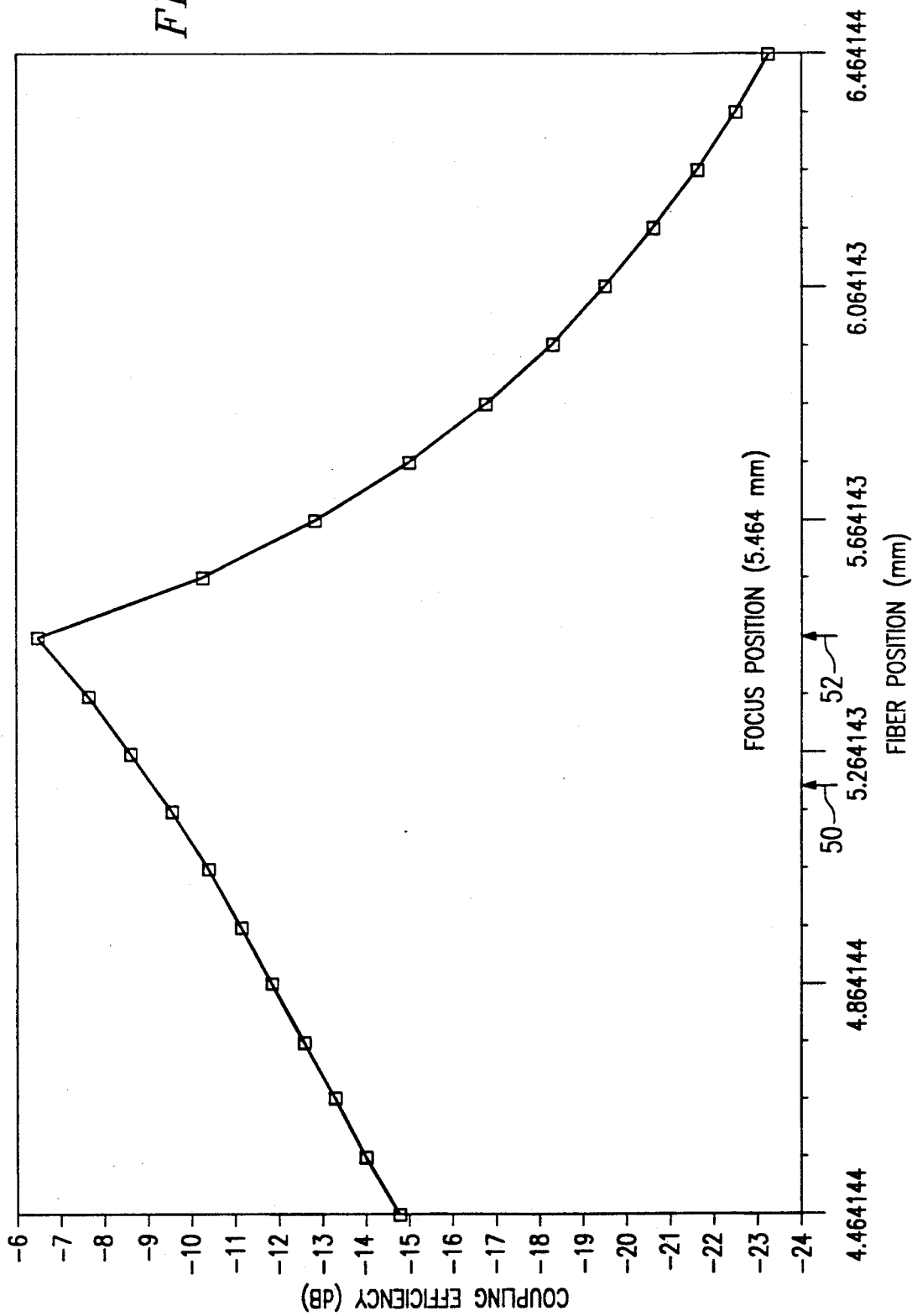
FIG. 3 is a graph illustrating the coupling efficiency as a function of axial fiber optic position.

In FIG. 1, a laser light source or transmitter 10 is illustrated situated at a distance $L_1$ from a focusing lens or device 12 which, in one embodiment, comprised a piece of cylindrical material with a parabolic refractive index distribution which was highest at its optical axis and decreased towards its periphery. The material of this lens is typically designated as a gradient or graded index (GRIN) material. By varying the pitch length of the lens, the exiting light can be collimated, focused or made to diverge. In this embodiment, it is designed to converge or focus at a distance $L_3$ from the laser 10.

A fiber optic cable core 14 is shown with an end 16, and a distance $L_4$ ahead of the minimum beam width (beam waist) or beam spot of the laser beam. A generalized outline of the shape of the light is illustrated. This light diverges from the light source 10 to a point within the focusing lens 12 and then starts converging. To the right of the minimum beam width, it again starts diverging as shown by the dash lines if the environment is such that it is so able. However, the core 14 is typically covered with a cladding-type material which prevents such divergence. As illustrated, the length of the focusing lens or material is designated as $L_2$. In one embodiment of the inventive concept, the distance $L_1$ was established at 600 microns, the distance $L_2$ was established at 3.457 millimeters, the distance $L_3$ was 9.521 millimeters, and the distance $L_4$ was 264 microns. A typical diameter of the fiber core 14 is eight microns while the cladding around this core 14 is typically in the neighborhood of 125 microns. The diameter of the lens itself in one embodiment of the inventive concept was 1.8 millimeters. A typical value for the diameter of the beam waist was 25 microns.

In FIG. 2, a pictorial representation of an optical module incorporating a light source lens and cable is illustrated with a base 20 having a pair of leads 22 and 24. To the right of the base 20, a laser diode 26 is shown for generating laser light and a backward wave detector 28 is illustrated for use as a control mechanism to control the amount of light generated by laser 26. Although not shown, there would be at least one further lead required to operate the two separate devices. A cap 30 is attached to the base 20 and the cap 30 includes a cylindrical lens 32 comparable to lens 12 of FIG. 1. The cylindrical lens 32 comprises material having a quadratic constant or parabolic refractive index distribution such that light passing therethrough is focused at a beam spot to the right of the end of the fiber optic cable.

A barrel or conduit portion 34 of cap 30 serves as a distance establishing tool for this light generated by diode 26. A fiber optic cable core 36 is shown in the center of a fiber optic cable connector having an outer case 38, a ceramic, plastic or other positioning core 40 and the protective and reflective cladding for the cable 36 being given a designation of 42. Solder may be used to hold the lens 32 in position and this solder is given a designation of 44. Although the lens 32 is made of a glass-like material, a metal coating on the glass will allow the soldering to provide a hermetic seal to the cap 30. A dash line 46 illustrates a cross section of the beam waist represented in FIG. 1 as the distance $L_3$ from the light source 26 to a point interior the fiber optic cable 36. For the purposes of further discussions in this patent, the distance $L_3$ is called the conjugate length and this distance is kept as nearly as possible constant within the aberrations, deviations or tolerances of manufacturing processes. In other words, there may be tolerance build-ups so that the line 46 is closer to or farther away from the end of cable 36 than is illustrated, and the installation process of the cable within the cable connector may cause the cable to be situated at an angle to the axis of the focused light beam to produce angular light reception problems, or it may be offset due to the manufacturing process or to the lack of concentricity or ellipsoidal configurations of any of the parts utilized in making the fiber optic connector.

In FIG. 3 a graph is illustrated where an arrow 50 is shown on a fiber position horizontal or X axis. A further arrow 52 is also shown on this axis. The other increments are merely distance indications from the lens 12 of FIG. 1. The vertical or Y axis illustrates relative coupling efficiency of a specific coupling device with the efficiency being the highest at position 52 and falling off very rapidly to the right of position 52 and less rapidly to the left of position 52.

If the minimum beam width point is adjusted to fall on surface 16 of cable 14, the maximum coupling efficiency will occur and is represented as a $-6.5$ db on the graph. It will be noted, however, that if manufacturing tolerances are such that the beam waist actually occurs to the left of the end 16 of cable 14, that the coupling efficiency very rapidly drops off such that a beam waist occurring 100 microns to the left of end 16 of fiber optic core 14 will reduce the coupling efficiency from $-6.5$ db to less than $-10$ db. In other words, there is already less than half the energy at this point. However, if the beam waist occurs interior to the end of cable 14 at point 50, then there can be considerable variation due to manufacturing tolerances and if the barrel 34 is too long, then the coupling efficiency will actually rise for a range of distance. In any event, there is less variation in coupling efficiency until there is such a tolerance build-up that the end of cable 14 would have to move more than 400 microns to the right of position 52 before even dropping off to the coupling efficiency designed into the module.

Figure 4:
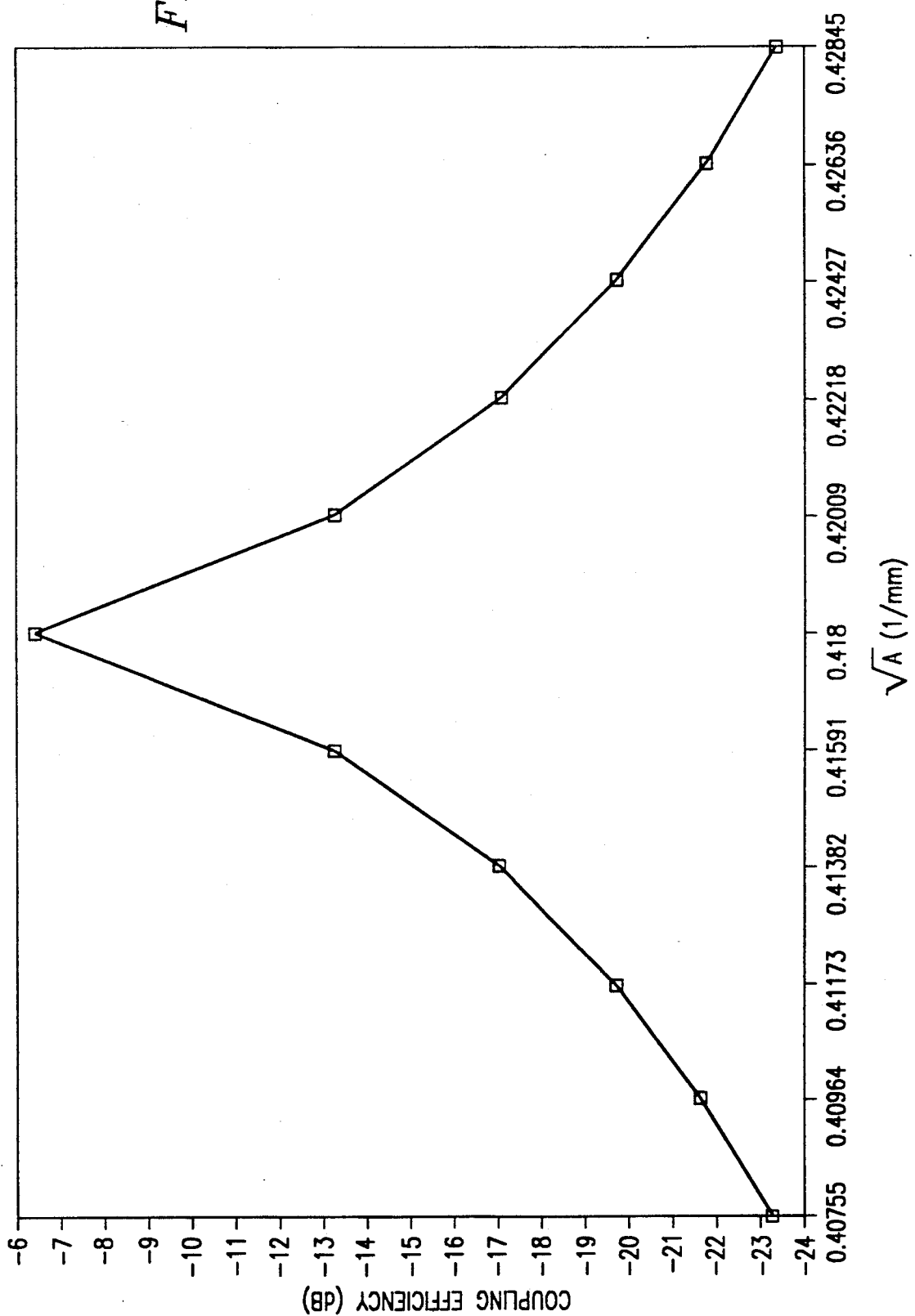
FIG. 4 is a graph showing the coupling efficiency of the system versus the refractive index gradient constant of the lens material.

In FIG. 4 the value of a refractive index gradient constant, designated as $A^{\frac{1}{2}}$ (1/mm), is shown on the horizontal axis and coupling efficiency is presented on the vertical axis. The manufacturer of this lens has a design value for $A^{\frac{1}{2}}$ of 0.418. However, this value can vary by as much as 2.5% in the production of the device. The chart of FIG. 4 shows that such a variation of 2.5% results in a change in coupling efficiency assuming no changes in manufacturing tolerances from approximately $-6.5$ db to as low as $-24$ db for a given length of lens 12 of FIG. 1 or 32 in FIG. 2.

Figure 5:
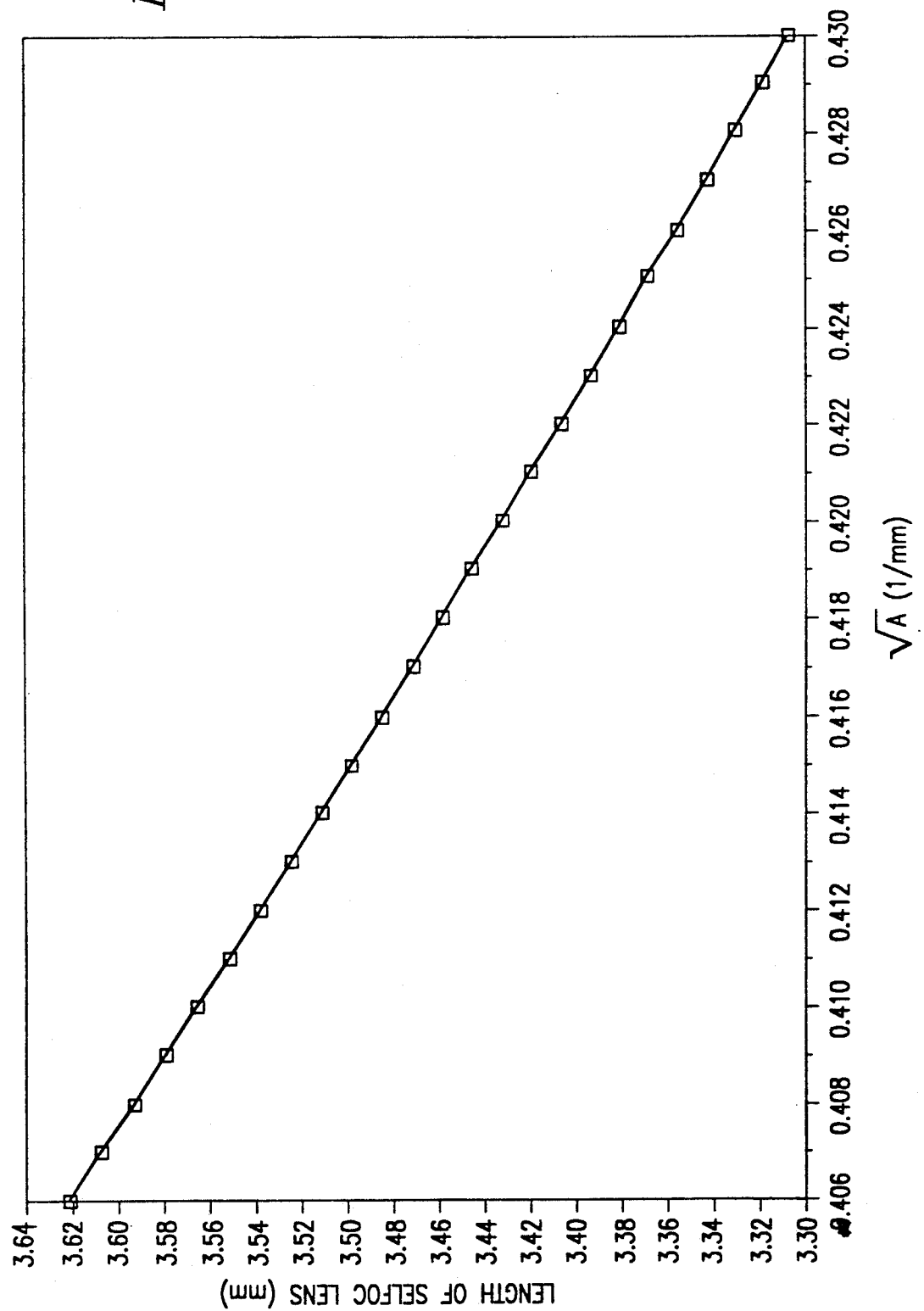
FIG. 5 is a graph showing the length of the lens material as a function of one of its primary optical properties for use in the system as defined.

The present inventors have established that the $A^{\frac{1}{2}}$ is a direct function of length of the lens and thus, FIG. 5 illustrates that by measuring the value of the optical properties, A can be determined and the length of the lens can be determined directly from the graph of FIG. 5 to establish a given length of $L_2$ of FIG. 1. In other words, when the value of the $A^{\frac{1}{2}}$ is at its nominal or design value, $L_2$ can be about 3.46 millimeters or as mentioned in conjunction with FIG. 1, 3.457 millimeters. However, if the $A^{\frac{1}{2}}$ is found to be 4.12, the length of the lens 12 needs to be 3.54 millimeters in length to keep the conjugate length or the distance $L_3$ at a constant value and thus, keep the barrel 34 and the other parameters of the device constant. Likewise, if the $A^{\frac{1}{2}}$ is found to be a very high value such as 0.424 millimeters, then the length of the lens must be a much shorter length such as 3.38 millimeters. The design of cap 30 and barrel 34 is such that these variations in lengths can be accommodated and it can still be soldered into place within cap 30, and the remaining parts of the module can be maintained within tolerable manufacturing parameters.

Figure 6:
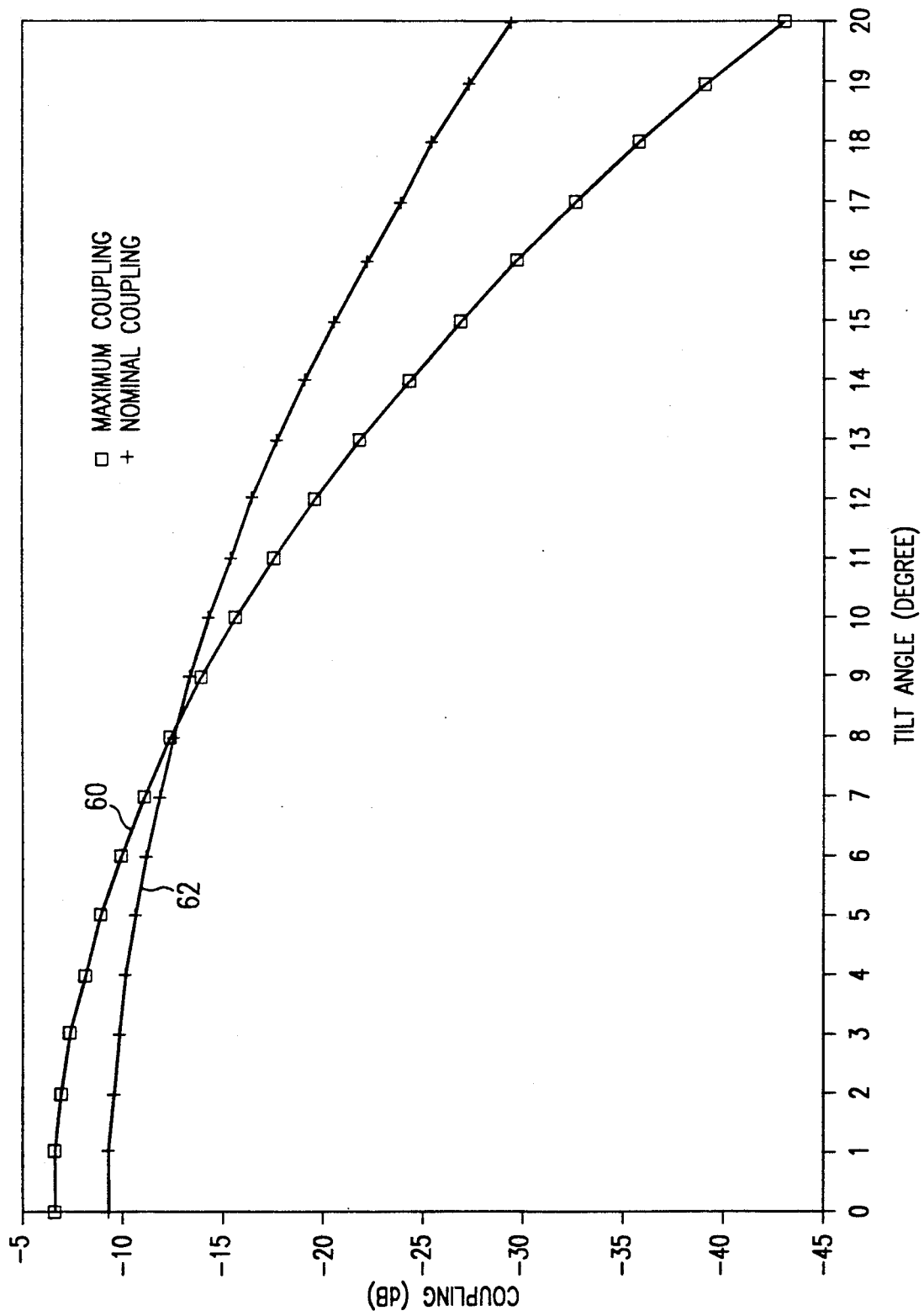
FIG. 6 is a graph illustrating the coupling efficiency as a function of angular alignment.

In FIG. 6 the horizontal axis represents the angular degrees of tilt of a fiber optic cable with respect to the beam axis of the focused light beam. The vertical or Y axis represents the electro-optical coupling in db. Two graphed lines are shown on the graph of FIG. 6 with a line 60 representing the maximum coupling obtainable where the beam waist coincides with the end of the fiber optic cable. A second line 62 represents the coupling obtained when a plane connecting the boundaries of the beam waist is situated interior the end of the fiber optic cable 14 or 36. As will be noted, the graph 60 drops off much more rapidly as the fiber optic cable is tilted or is in axial misalignment with the focused light beam than does graph 62. Thus, manufacturing aberrations or inconsistencies will have less effect on the amount of coupling when the light is focused inside the cable as shown by graph 62, thereby making the manufacturing yield higher for a given set of tolerances.

Figure 7:
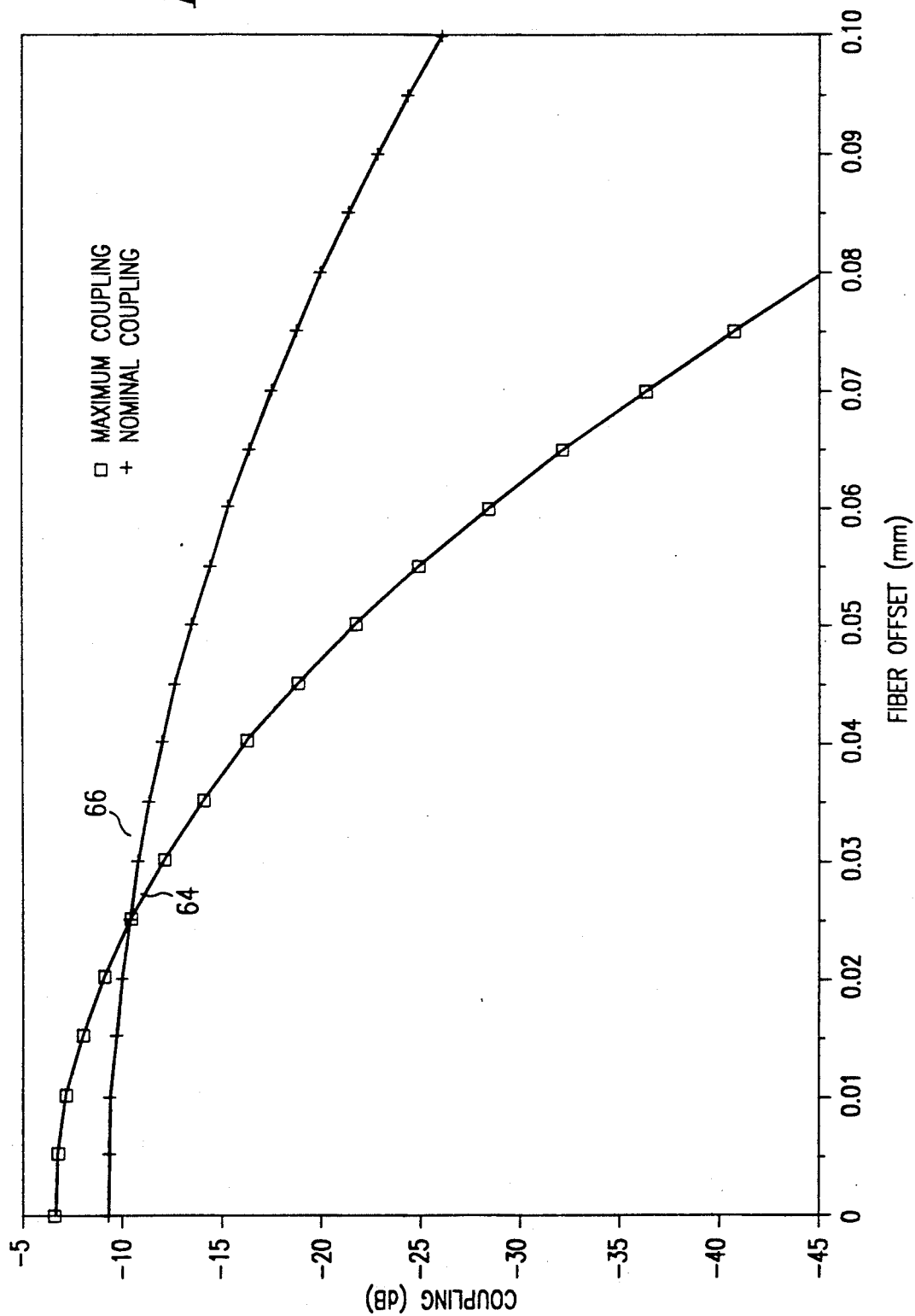
FIG. 7 is a graph illustrating coupling efficiency versus radial alignment or, in other words, fiber offset.

FIG. 7 is similar to the graph of FIG. 6 except that it shows the two curves obtained for fiber offset (radial misalignment) of the fiber optic cable with respect to the axis of the focused light beam. Graph 64 represents the coupling obtained when the beam waist coincides with the end of the cable while the graph 66 represents the coupling obtained when a plane connecting the points of the beam waist lies interior the end of the fiber optic cable. As indicated in FIG. 6, the maximum coupling curve 64 falls off in coupling much faster than does the nominal coupling curve 66.

Figure 8:
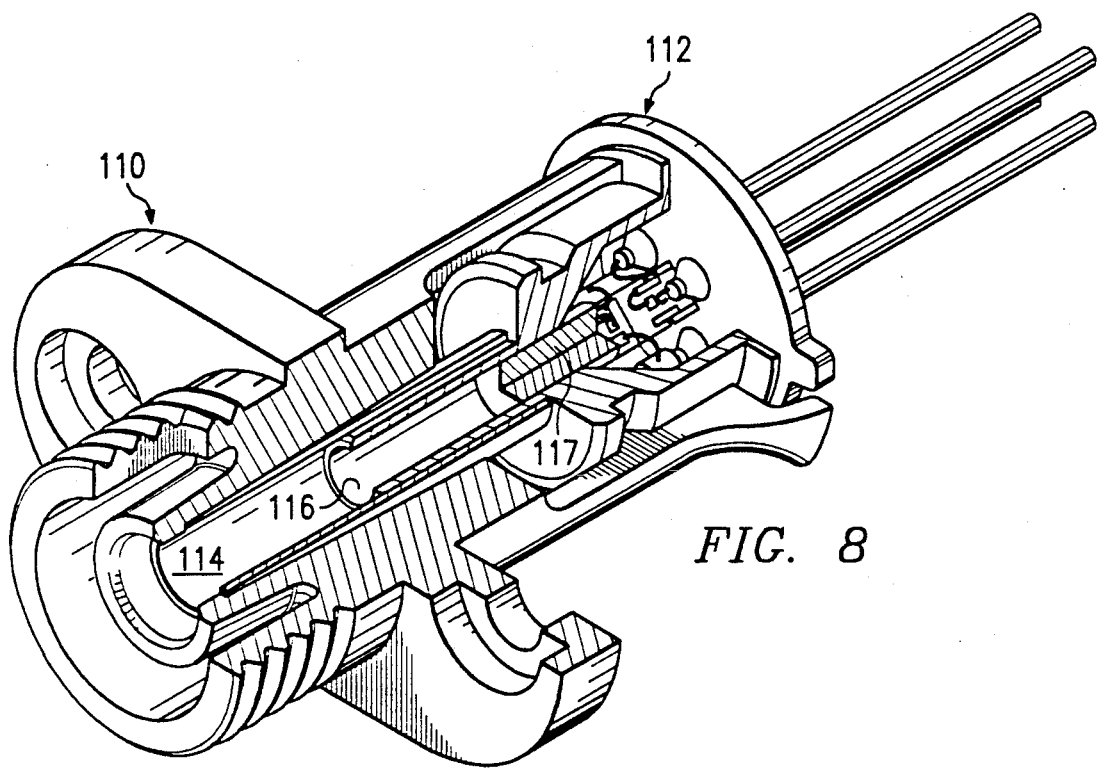
FIG. 8 is an isometric drawing of the inventive concept used in a transmitter type-diode to fiber optic cable device.

FIG. 8 shows a base 110 which is adapted for receiving a transmitter or receiver module. A transmitter module is shown in FIG. 8 and given a designation of 112, where device 112 is substantially the same as the left-hand portion of FIG. 2 comprising base 20, the housing 30 and the extension 34. Not shown is the fiber optic cable which typically is inserted in an opening 114 so as to rest against an end 116 of the extension of transmitter 112.

Figure 9:
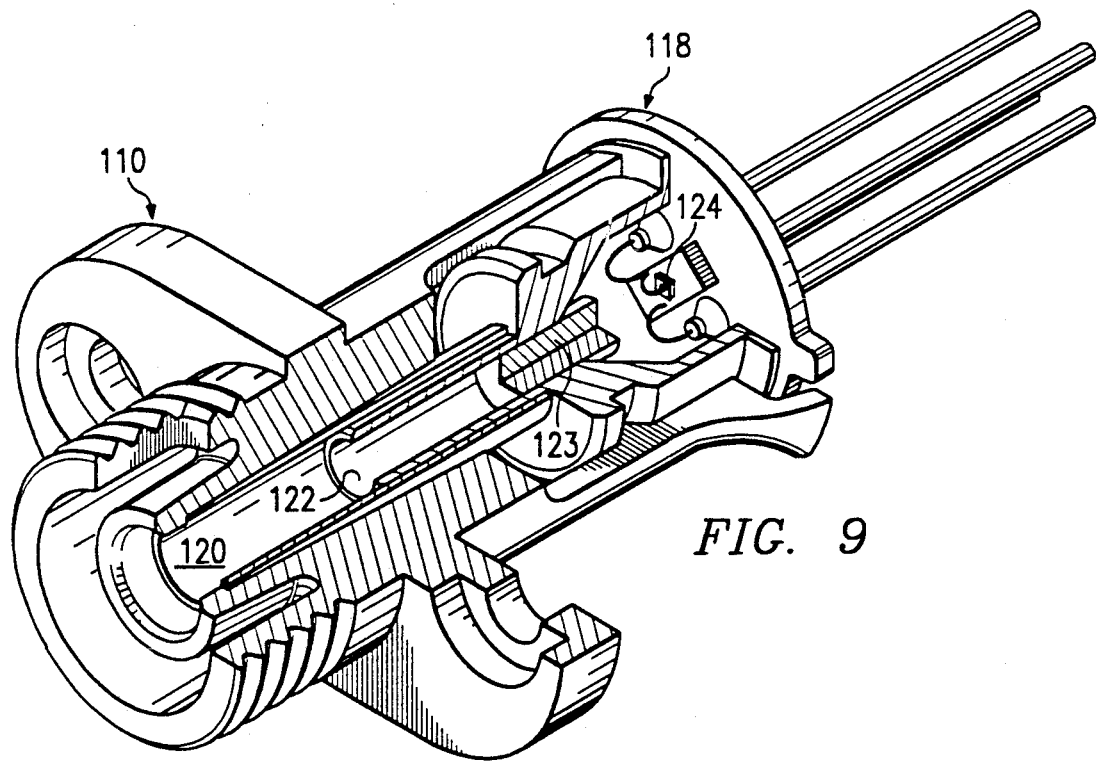
FIG. 9 is an isometric view of a fiber optic cable to diode detector-type device.

FIG. 9 is designed to use the same housing as is FIG. 8 and thus is given the same designator of 110. A module designated as 118 is a receiver, as opposed to the transmitter module 112 of FIG. 8. The prime difference being that in FIG. 8 the laser signal is generated on device 112 and passed to the fiber optic cable, whereas in FIG. 9 a laser signal is received from a fiber optic cable by the receiver 118. Otherwise, FIG. 9 is extremely similar in receiving a fiber optic cable within a cavity 120, and where the fiber optic cable is positioned against an extension 122 in the manner shown of FIG. 2.

FIG. 10 shows a bulkhead splice, or coupler with a mounting means or base 125, having a circular opening filled by connector adapters 127 and 129. The circular opening has ribs, ridges or teeth 131 and 133 with an indented portion or recessed channel 135. A coacting rib, ridge or tooth 137, comprising a part of adapter 127 holds adapter 127 in place. The ribs 131 and 137 are both deformable and thus with force, the adapter 127 can either be inserted or removed. A similar rib 139 on adapter 129 coacts with rib 133 in a similar manner. Internal to the two adapters 127 and 129, there is a GRIN lens 139 forming a focusing function between fiber optic cables in a manner previously explained with FIG. 2 and likewise occurring in connection with FIGS. 8 and 9. A first fiber optic cable would abut a cylindrical extension 141, and a further cable would abut an extension 142. As will be noted, the manner of inserting and disassembling the adapters 127 and 129 allow the threads on these two devices to be different for mating with different fiber optic cable connectors. Further, the adapters can be designed so that one cable can use a rectangular connector, while a different cable can use a threaded connector. It should also be noted that with this design, the overall device of FIG. 10 can easily be used to pass optical signals from single-mode to multi-mode cable and back. In addition, the lens 144 can be replaced with a polarizing structure or filter so that only signals of a given phase are passed from one cable to another. In other words, FIG. 10 can be used not only as a coupling device for providing optimal laser signal transfer from one fiber optic cable to another of the same or different construction and type, but can also be used as a phase sensitive switch in addition to or as an alternative to the originally described function.

OPERATION

The main objective of the present invention was to improve the yield of an optical coupling device. By designing the device such that the beam waist of a focused light beam occurs beyond the end of a receiving fiber optic cable, deviations in alignment due to tolerance build-ups and to lack of concentricity of parts of the optical coupling device, results in a lessened amount of degradation of signal as compared to the prior art approach of attempting to have the beam waist of a focused light beam situated at the end of the fiber optic cable.

As shown in FIG. 3, maximum coupling is obtained for one embodiment of the invention and with given dimensions when the focus occurs at the end of the cable or, in other words, at position 52 of FIG. 3. However, if manufacturing tolerances are such that the beam waist occurs prior to the end of the cable or, in other words, with respect to FIG. 1 to the left of end 16 by as little as 100 microns, FIG. 3 illustrates that the coupling efficiency drops from −6.5 db to at least −10 db. Further changes in position of beam waist to the left results in similar drops of coupling efficiency. If, on the other hand, the design is such that the beam waist occurs to the right of the end 16 of the fiber optic cable such as shown in FIG. 1, and designated as position 50 in FIG. 3, tolerance build-up to cause the beam waist to move to the left will actually increase the coupling efficiency. On the other hand, tolerance build-up to cause the beam waist to move to the right will lower the coupling efficiency by a smaller amount relative to the design value than would occur if the design value were at point 52 on the curve of FIG. 3. The positional alignment presently being examined is designated by those skilled in the art as axial alignment and is concerned with the position of the fiber optic cable along a line parallel to the axis of the beam.

FIG. 6 illustrates the coupling efficiency for the tilt angle or, in other words, the angle of the fiber optic cable with respect to a line parallel to the axis of the focused beam. As mentioned previously, coupling efficiency drops off with changes in tilt angle by a greater amount if the beam waist lies exactly at the end 16 of cable 14 than it does if the beam waist occurs at a point inside the end of cable 14.

FIG. 7 shows very similar results for radial offset or for the offset occurring when the center of fiber 14 is not coincident with the center of the focused beam or the beam waist but rather is in the fringes of the waist of the light beam.

The focusing of the signal from light source 10 can be accomplished using of many focusing lenses. The lens can be moved relative to the light source 10 so as to establish a beam waist inside the end of cable 14.

A preferred embodiment of the present inventive concept utilizes a graded index material in the form of a cylindrical lens 12 whose length is adjusted to establish a predefined conjugate length shown in FIG. 1 as $L_3$. With the approach of the present invention, the distance $L_1$ may be maintained constant to accomplish the conjugate length of $L_3$ by adjusting $L_2$. The primary variable of the graded index lens 12 is its refractive index gradient constant. This refractive index gradient constant is typically referred to, by those skilled in the art, as a function of the $A^{\frac{1}{2}}$. The value of the $A^{\frac{1}{2}}$ can vary over different batches of material used to make a lens over a range of 2.5%. For a given coupling device, the coupling efficiency for such a range of the value of A, will cause a coupling efficiency variation of approximately 18 db. An 18 db variation is close to 63 times in change from maximum to minimum coupling efficiency. It is very apparent that such an alteration in coupling efficiency would not be tolerated in any commercial device. It has been ascertained, however, that the length of the lens is a very definable and directly related value to the $A^{\frac{1}{2}}$ as shown by the graph of FIG. 5. Thus, it is a simple procedure to measure the optical properties of the lens and cut it to a length to achieve a constant total refractive index gradient constant to keep the length $L_3$ constant as well as length $L_1$ such that only $L_2$ varies. The design of the optical coupling module of FIG. 2 shows the lens $L_2$ mounted within barrel 34 and providing adequate room to accept different lengths of $L_2$ while keeping the distance of the end adjacent the diode 26 at a constant value and using the dimensions of barrel 34 and 38 to keep the distance $L_3$ at a reasonably constant value.

As explained previously, even if the fiber optic core 36 within barrel 38 is radially or angularly misaligned with respect to the center of the focused beam, the variation in coupling efficiency can well remain within acceptable limits. Further, variations in the dimensions of the length of barrel 34 or the positioning of diode 26 can also be tolerated without as much adverse effect as would have occurred using the prior art focusing techniques.

As indicated in the Detailed Description, FIGS. 8 and 9 are merely further isometric views of FIG. 2 for transmitter and receiver respectively, where, in FIG. 8, the object of the GRIN lens is to focus the light from the photodiode to a point inside the attached fiber optic cable in a manner shown in FIG. 2. FIG. 9, on the other hand, uses the same concept as a receiver where the light source is the fiber optic cable, and the GRIN lens 123 is adjusted in length to focus the beam of the received light on the surface of the receiver detector material, such as the portion 124.

It should be noted that while FIGS. 8 and 9 both practice the concept of adjusting the length of the GRIN lens to achieve a specific distance from a light source to a beam waist of focused light signals and defined as a conjugate length, the distance that is held constant in FIG. 8 is the distance from the light source or diode to the GRIN lens 117. In FIG. 9 the distance that is held constant is the distance from the GRIN lens to the light sink or receiver diode. Referring back to FIG. 1, it will thus be noted that what is being held constant in the receiver apparatus of FIG. 9 is the distance ($L_3-L_1-L_2$) or the distance from the GRIN lens to the light sink. In the transmitter, the distance that is being held constant is $L_1$ or the distance from the light source to the GRIN lens.

In the following description of operation for FIG. 10, the distance that is to be held constant is one or the other of the distance between the light source and the GRIN lens or the light sink and the GRIN lens. Holding either one constant will achieve the desired objective.

Material 144 in FIG. 10 is a GRIN lens used to focus light from the cable at one of the adapters, such as 127, to a point inside the fiber optic cable of the other adapter such as adapter 129. Again, the same principles are involved, as previously discussed in connection with FIGS. 1 and 2, in that the GRIN lens is adjusted in length to perform the focusing at the right point. FIG. 10, however, does provide the unique functionality of being easily adaptable to different situations since the two adapters 127 and 129 can be removed independent of the interior cartridge comprising the fiber optic cable positioning means 141 and 142, the GRIN lens 144 and associated split sleeve labeled 146 and 148 used to help align fiber optic cable with the extensions 141 and 142. Further, this entire interior cartridge or assembly can be replaced with an optical polarizing filter in the position shown by GRIN lens 144, and provide the basis for a fiber optic switch.

In view of the above, we wish to be limited not by the single embodiment illustrated using a graded index lens of the cylindrical-type but only by the concepts presented and claimed in this patent application and as set forth more fully in the following claims.

I claim:

1. A light source to fiber optic cable coupling device comprising, in combination:
    coupling device means for providing a constant separation between a light source and a light sink;
    light source means situated at one end of said coupling device;
    light sink conduit means situated at the other end of said coupling device; and
    unitary gradient index lens means, situated between said light source means and said other end of said coupling device and not being in physical contact with said light source means and said light sink means, for focusing light passing through said lens means to define a beam waist, said lens means being of a length wherein its parabolic refractive index distribution causes the beam waist of the light passing through said gradient index lens means to occur beyond said other end of said coupling device.

2. A graded index lens optical system comprising, in combination:
    light source means; and
    unitary graded index lens means, physically separated from and situated a first fixed distance from said light source means and whose length is selected as a function of the refractive index gradient constant thereof to obtain a beam waist beyond an end of said lens means at a second fixed distance from the light source means.

3. Apparatus comprising, in combination:

light source means;

single mode fiber optic cable means having a cable end for receiving light to be transmitted and situated a fixed distance from said light source means; and unitary lens means, situated between said light source means and said cable means and not in physical contact with at least one of said light source and cable means, for focusing light from said light source means toward said cable means whereby an axis of the focused beam central to a beam waist of the focused light beam occurs inside the end of said cable means.

4. Apparatus comprising, in combination:

light source means;

fiber optic cable situated a fixed distance from said light source means and having a cable end for receiving light to be transmitted; and graded index lens means, situated between and not in physical contact with either of said light source means and said cable, of a physical length appropriate for focusing light from said light source means toward said cable to define a beam waist whereby an imaginary plane passing through points defining a beam waist of the focused light beam lies inside the end of said cable.

5. Optic coupling apparatus comprising, in combination:

light source means;

fiber optic cable means situated a fixed distance from said light source means having a cable end for receiving light to be transmitted; and graded index lens means having a physical length, situated a predetermined distance from said light source and between but not in physical contact with at least one of said light source means and said cable means, for focusing light from said light source means toward said cable means to define a beam waist whereby an imaginary plane passing through points defining a beam waist of the focused light beam lies inside the end of said cable means.

6. Electrical-optic coupling apparatus comprising, in combination:

light source means;

light detecting means for reacting to received light; and graded index lens means having a parabolic refractive index distribution, adjusted to a length which length is a function of its parabolic refractive index distribution, situated a predetermined distance from and light detecting means and situated therebetween, for focusing light from said light source means toward said light detecting means to define a beam waist at a predetermined point with respect to said light detecting means.

7. Coupling apparatus comprising, in combination:

light signal source;

light signal receiving means for receiving light signals;

mechanical base means for establishing a predetermined distance between said light signal source and said light signal receiving means; and graded index lens means having a parabolic refractive index distribution, which has been physically adjusted to a length which length is a function of its parabolic refractive index distribution, mounted in said base means and situated a predetermined distance from and not in physical contact with at least one of said light signal source and said light signal receiving means and situated therebetween, for focusing light from said light signal source toward said light signal receiving means.

8. Signal coupling apparatus comprising, in combination:

fixed length coupler means including a light source and a light receiver situated at first and second predetermined distances (L3-L4) one from the other where L3 is a predefined conjugate length and L4 is a design distance from an end of said light receiver to point interior said light receiver; and graded index lens means, adjusted to a length which length is a function of its parabolic refractive index distribution, situated a third predetermined distance L1 from said light source and between said light source and said light receiver means, for focusing light from said light source toward said light receiver means.

9. Signal coupling apparatus of fixed dimensions incorporating a lens whose parabolic refractive index distribution varies widely from unit to unit comprising, in combination:

fixed length signal coupler means including a light source and a light receiver situated at first and second predetermined distances one from the other; and a unitary length of graded index lens material having a parabolic refractive index distribution, the length of a given piece of lens material in a coupling apparatus being accordance with the parabolic refractive index distribution for that piece, situated a third predetermined distance from said light source and between and light source and said light receiver means, for focusing light from said light source toward said light receiver means wherein a beam waist of the focused light occurs within said light receiver.

10. Signal coupling apparatus incorporating a lens whose parabolic refractive index distribution varies widely from unit to unit comprising, in combination:

signal coupler means designed for accurately fixing the distance between a light source and a light receiver at a predetermined value; and a length of graded index lens material having a parabolic refractive index distribution, the length of a given piece of material being individually determined in accordance with the parabolic refractive index distribution for that piece, situated a predetermined distance from the light source position of said coupler means and between the light source position and the light receiver position, for focusing light from said light source toward said light receiver.

* * * * *